United States Patent
Hatauchi et al.

(12)

(10) Patent No.: US 6,441,472 B1
(45) Date of Patent: Aug. 27, 2002

(54) SEMICONDUCTOR DEVICE AND METHOD OF MANUFACTURING THE SAME

(75) Inventors: Kazushi Hatauchi; Tadashi Mitarai, both of Tokyo (JP)

(73) Assignees: Mitsubishi Denki Kabushiki Kaisha; Mitsubishi Electric Engineering Co., Ltd., both of Tokyo (JP)

(*) Notice: Subject to any disclaimer, the term of this patent is extended or adjusted under 35 U.S.C. 154(b) by 0 days.

(21) Appl. No.: 09/680,304

(22) Filed: Oct. 6, 2000

(30) Foreign Application Priority Data

Oct. 14, 1999 (JP) .......................................... 11-291918

(51) Int. Cl.[7] .......................................... H01L 23/495
(52) U.S. Cl. ...................................... 257/666
(58) Field of Search .............................. 257/778, 787, 257/666, 667

(56) References Cited

U.S. PATENT DOCUMENTS 6,118,184 A * 9/2000 Ishio et al. ................. 257/787

FOREIGN PATENT DOCUMENTS

| JP | 60-245291 | 12/1985 |
|----|-----------|---------|
| JP | 4-25166   | 1/1992  |

* cited by examiner

*Primary Examiner*—David Nelms
*Assistant Examiner*—Thao Le
(74) *Attorney, Agent, or Firm*—McDermott, Will & Emery

(57) ABSTRACT

The front surface (where a bonding electrode is located) of a first semiconductor chip 1*a* is bonded to a die-pad portion of a lead frame by an adhesive 4. The rear surface of the second semiconductor chip 1*b* is bonded to the rear surface of the first semiconductor chip 1*a*. The surface electrode of the first semiconductor chip 1*a* is electrically connected to an inner lead portion 3 of the lead frame by a bonding wire. The surface electrode of the second semiconductor chip 1*b* is connected to the inner lead potion 3 of the lead frame by the bonding wire.

4 Claims, 10 Drawing Sheets

SEMICONDUCTOR DEVICE AND METHOD OF MANUFACTURING THE SAME

BACKGROUND OF THE INVENTION

The present invention relates to the structure of a multi-chip type semiconductor device in which a plurality of semiconductor chips are mounted, and a method for manufacturing it.

FIG. 11 is a sectional view of a conventional laminated multi-chip type semiconductor device disclosed in e.g. the Unexamined Japanese Patent Application Publication No. Hei 1-235363. In FIG. 11, reference numeral 101a denotes an upper semiconductor chip; 101b a lower semiconductor chip; 102 a tab; 103 an adhesive for pellet fixing such as an Ag paste; 104 a non-conductive adhesive for pellet fixing; 105a, 105b bonding wires; 106 a lead frame; and 107 resin for mold sealing.

FIG. 12 is a perspective view of a conventional laminated multi-chip type semiconductor device disclosed in e.g. the Japanese Patent Application Publication No. Hei 4-25166. In FIG. 12, reference numerals 111a, 111b denote a first and a second semiconductor chip; 112 a connecting electrode; and 113 a lead.

A detailed explanation will be given of the structure of the above semiconductor device.

In FIG. 11, the lower semiconductor chip 101b is pellet-fixed onto the tab 102 by the pellet-fixing adhesive 103 such as Ag paste. The upper semiconductor chip 101a is pellet-fixed onto the lower semiconductor chip 101b by the non-conductive adhesive for pellet-fixing 104. Further, the upper and lower semiconductor chips 101a and 101b are connected to the lead frame 106 by the bonding wires 105a and 105b, respectively. These components are sealed by the mold sealing plastic 107 such as resin.

In FIG. 12, the semiconductor chips 111a and 111b have connecting electrodes 112 on the opposite two sides, respectively. These semiconductor chips 111a and 111b are arranged so that they are orthogonal to each other (i.e. the connecting electrodes 112 of the semiconductor chips 111a and 111b are not located on the same sides). These semiconductor chips 111a and 111b are fixedly superposed on each other by an adhesive. The connecting electrodes 112 are provided with leads 113 for electric connection.

The conventional laminated multi-chip type semiconductor device is structured as described above. Therefore, in the structure of FIG. 11, the upper semiconductor chip must be sufficiently smaller in size than the lower semiconductor chip. The semiconductor chips having equal sizes cannot be combined with each other.

Further, in the structure of FIG. 12, the connecting electrodes of the first and the second semiconductor chip must be arranged so that they are located on only two sides, respectively, and not located on the same sides as the other. In addition, combination of the upper and lower or first and second semiconductor chips must be carefully taken in consideration.

SUMMARY OF THE INVENTION

The present invention has been accomplished in order to solve the above problems, and intends to provide a laminated multi-chip type semiconductor device which is not required to consider the sizes of laminated semiconductor chips and the electrode arrangement in each semiconductor chip. The invention also intends to provide a method for manufacturing it.

The invention of the semiconductor device defined in claim 1 comprises: a first semiconductor chip with a front surface side (where a bonding electrode is located) bonded to a die-pad portion of a lead frame, and a second semiconductor chip with a rear surface bonded to the rear surface of the first semiconductor chip, and is characterized in that an electrode on the front surface of said first semiconductor chip and an inner lead portion of the lead frame are electrically connected to each other by a wire, and an electrode on the front surface of said second semiconductor chip and the inner lead portion are electrically connected to each other by the wire.

The invention of the semiconductor device defined in claim 2 is characterized in that said die-pad portion of the lead frame is divided into plurality portions and/or has a hole, and through the divided portion and/or the interior of the hole, the wire is electrically extended from the electrode of the first semiconductor chip to the inner lead portion of the lead frame.

The invention of the semiconductor device defined in claim 3 is characterized in that a plurality of first semiconductor chips are bonded to the die-pad portion of the lead frame.

The invention of the semiconductor device defined in claim 4 is characterized in that a plurality of the second semiconductor chips are bonded to said first semiconductor chip.

The invention of a method of manufacturing a semiconductor device defined in claim 1 comprises: a first die bonding step of bonding the front surface (where a bonding electrode is located) of a first semiconductor chip on a die-pad portion of a lead frame; a first wire bonding step of electrically connecting the electrode on the front surface of the first semiconductor chip to an inner lead portion of the lead frame by a wire; a second die bonding step of bonding rear surfaces of said first and said second semiconductor chip to each other; and a second wire bonding step of electrically connecting an electrode on the front surface of said second semiconductor chip to the inner lead portion of the lead frame by the wire.

The invention of a method of manufacturing a semiconductor device defined in claim 2 comprises a first die bonding step of bonding the front surface (where a bonding electrode is located) of a first semiconductor chip on a die-pad portion of a lead frame; a second die bonding step of bonding rear surfaces of said first and a second semiconductor chip to each other; a first wire bonding step of electrically connecting the electrode on the front surface of the first semiconductor chip to a inner lead portion of the lead frame by a wire; a second wire bonding step of electrically connecting an electrode on the front surface of said second semiconductor chip to the inner lead portion of the lead frame by a wire.

The invention of a method of manufacturing a semiconductor device defined in claim 3 comprises a first die bonding step of bonding the front surface (where a bonding electrode is located) of a first semiconductor chip on a die-pad portion of a lead frame; a second die bonding step of bonding rear surfaces of said first and a second semiconductor chip to each other; a second wire bonding step of electrically connecting an electrode on the front surface of said second semiconductor chip to an inner lead portion of the lead frame by the wire; and a first wire bonding step of electrically connecting the electrode on the front surface of the first semiconductor chip to the inner lead portion of the lead frame by the wire.

DETAILED DESCRIPTION OF THE PREFERRED EMBODIMENTS (First Embodiment)

Figure 1:
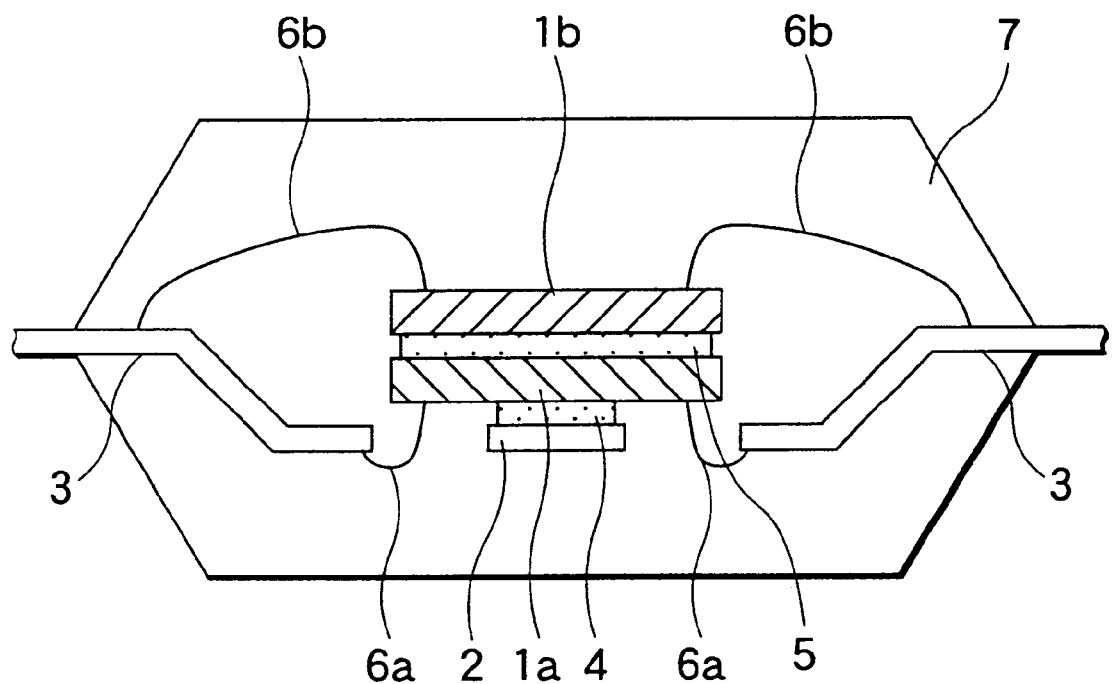
FIG. 1 is a sectional view showing a semiconductor device according to the first embodiment of the invention.

FIG. 1 is a sectional view of a semiconductor device according to the first embodiment. First, an explanation will be given of the structure of the semiconductor device according to the first embodiment.

In FIG. 1, reference numeral $1a$ and $1b$ denote a first and a second semiconductor chip within which a semiconductor integrated circuit is formed. The first semiconductor chip $1a$ is bonded to the die-pad portion 2 of a lead frame by means of an adhesive 4 so that its front surface on which a bonding electrode is provided is oriented downward, or toward the adhesive 4. The second semiconductor chip $1b$ is bonded in its rear surface to the rear surface of the first semiconductor chip $1a$ by means of an adhesive 5.

The bonding electrode on the front surface of the first semiconductor chip $1a$ is connected to the inner lead portion 3 of the lead frame by a bonding wire $6a$. The bonding electrode on the front surface of the second semiconductor chip $1b$ is connected to the inner lead portion 3 of the lead frame. These components are wholly sealed by sealant (molding resin).

Figure 2:
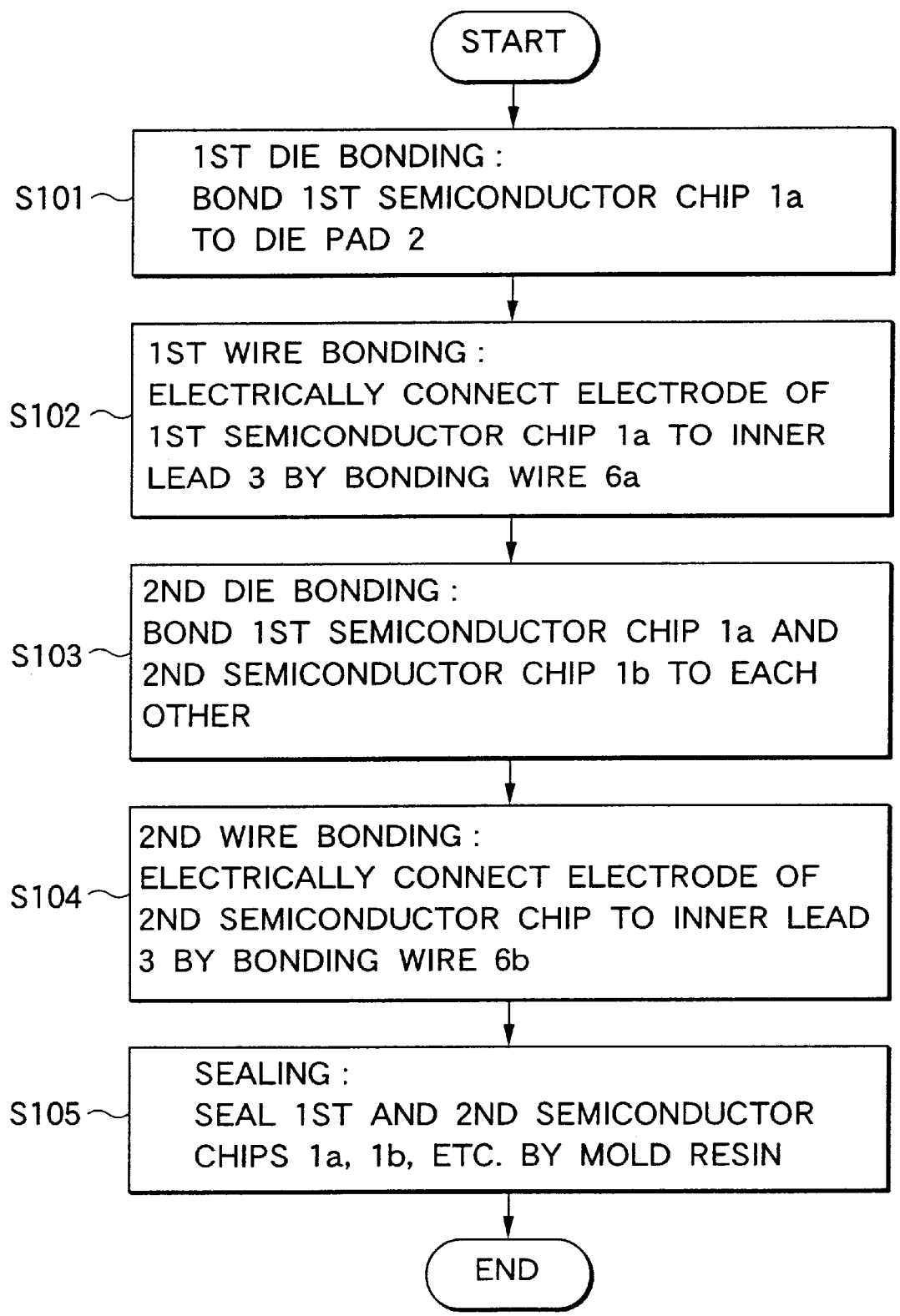
FIG. 2 is a flowchart showing a method for manufacturing the semiconductor device according to the first embodiment of the invention.
Figure 3A:
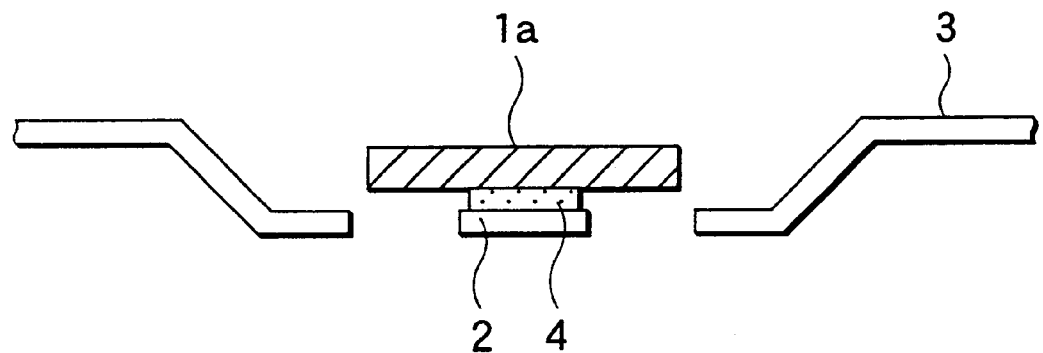
FIGS. 3A to 3C are longitudinal sectional views showing a process for manufacturing the semiconductor device according to the first embodiment of the invention.

Now referring to FIGS. 2 to 4, an explanation will be given of a method for manufacturing the semiconductor device according to the first embodiment. FIG. 2 is a flowchart showing the method for manufacturing the semiconductor device according to the first embodiment. FIGS. 3A to 4B are longitudinal sectional views illustrating the respective manufacturing steps.

(1) First Die Bonding Step (S101 in FIG. 2)

As shown in FIG. 3A, an adhesive 4 is applied or pasted on a die-pad portion 2 of a lead frame. The adhesive is non-conductive and is of a paste- or film-type. A first semiconductor chip $1a$ with its front surface oriented downward or toward the adhesive 4 is bonded to the die-pad portion 2. In this case, as the bonding technique, the flip-chip bonding technique is used in which the surface electrode of the semiconductor chip and a substrate electrode aligned oppositely to each other are bonded to each other by pressurizing or heating.

The above step is referred to as the first die bonding step. In the die bonding step, the areas of the die-pad portion 2 of the lead frame and adhesive 4 are required not to overlap the electrode on the surface of the first semiconductor chip $1a$ and not excessively narrow to keep their bonding strength with the first semiconductor chip $1a$.

(2) First Wire Bonding Step (S102 in FIG. 2)

Figure 3B:
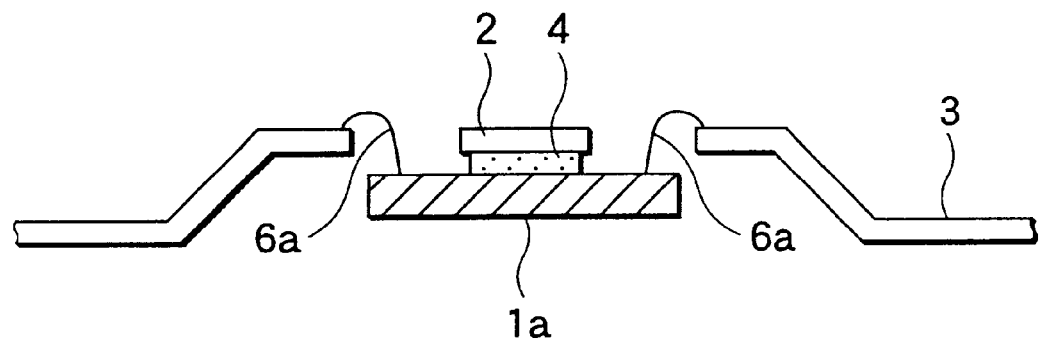
Figure 3C:
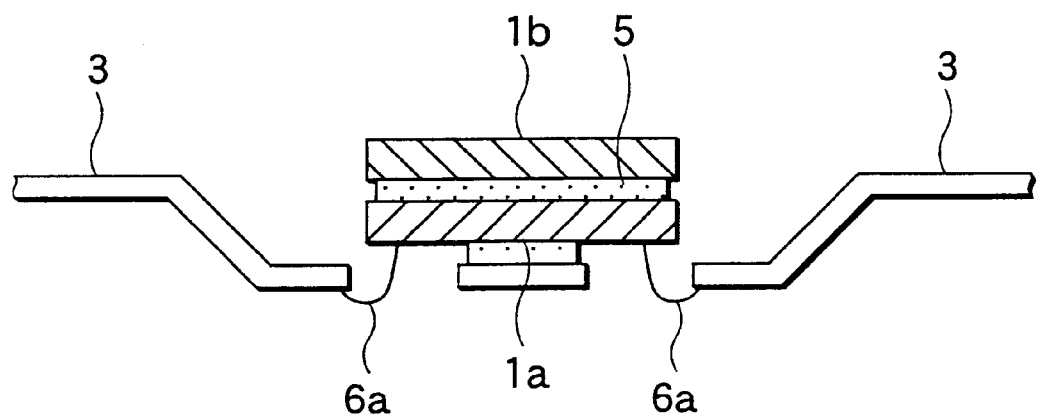

As shown in FIG. 3B, with the lead frame being located upside down, i.e. the front surface of the first semiconductor chip $1a$ bonded to the die-pad portion 2 of the lead frame being oriented upward, the electrode on the front surface of the semiconductor chip $1a$ and the inner lead portion 3 of the lead frame are electrically connected to each other by a bonding wire $6a$. In this case, in order that the electrode on the first semiconductor chip $1a$ is bonded to the inner lead portion 3 of the lead frame by the tip of the bonding tool for forming the bonding wire $6a$, the inner lead portion 3 of the lead frame must be spaced apart by a prescribed distance from the die-pad portion 2. This step is referred to as the first wire bonding step.

(3) Second Die Bonding Step (S103 in FIG. 2)

As shown in FIG. 3C, again, the lead frame is located upside down, i.e. the rear surface of the first semiconductor chip $1a$ bonded to the die-pad portion 2 of the lead frame is oriented upward. An adhesive 5 is applied or pasted on the rear surface of the first semiconductor chip $1a$ where no bonding electrode is located. The adhesive 5 may be conductive or non-conductive, and paste- or film-type.

With the front surface of a second semiconductor chip $1b$ (where the electrode is located) being oriented upward, from above the adhesive 5, the rear surface of the second semiconductor chip $1b$ and the rear surface of the first semiconductor chip $1a$ are bonded to each other. This step is referred to as the second die bonding step.

(4) Second Wire Bonding Step (S104 in FIG. 2)

Figure 4A:
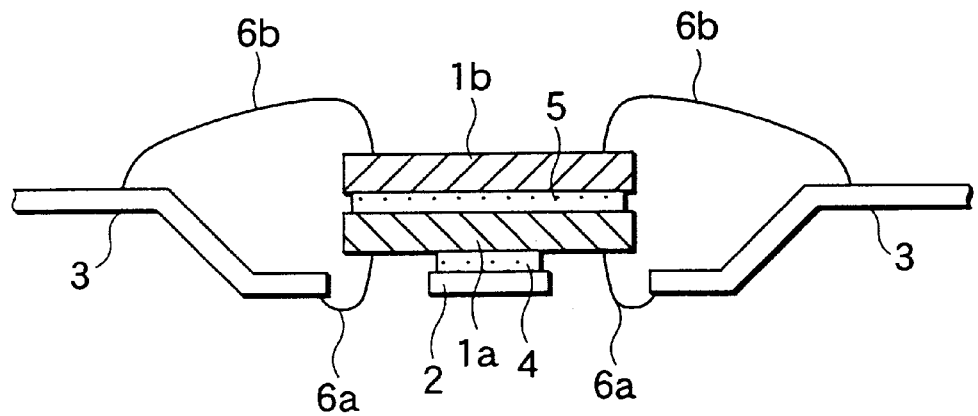
FIGS. 4A and 4B are longitudinal sectional views showing a process for manufacturing the semiconductor device according to the first embodiment of the invention.
Figure 4B:
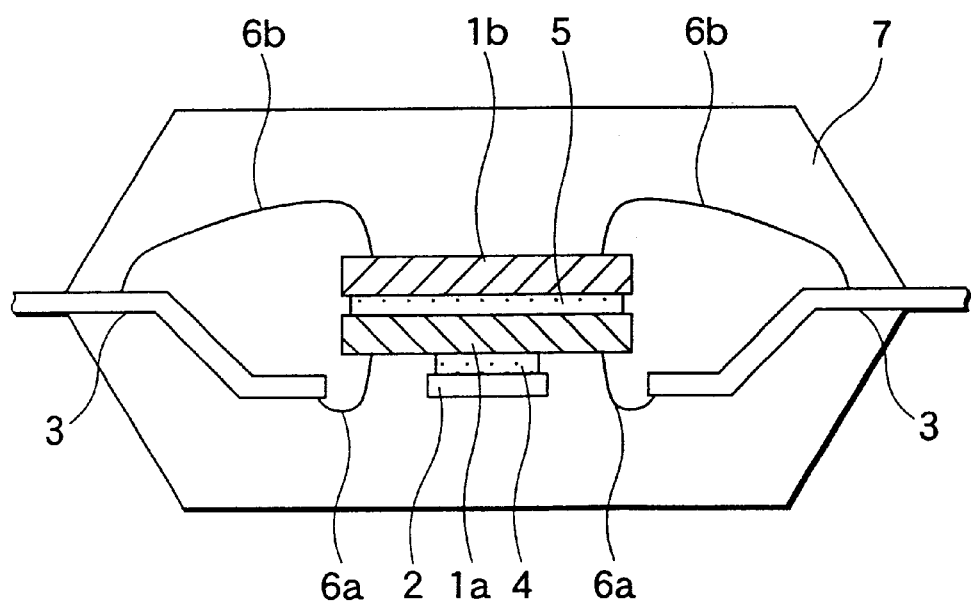

As shown in FIG. 4A, the electrode on the front surface of the second semiconductor chip $1b$ is electrically connected to the lead frame portion 3 by a bonding wire $6b$. This step is referred to as the second wire bonding step.

(5) Sealing Step (S105 in FIG. 2)

Finally, as shown in FIG. 4B, the first and the second semiconductor chip $1a$, $1b$, die-pad portion 2 of the lead frame, inner lead portion 3, bonding wires $6a$, $6b$, etc. are sealed by a sealant (mold resin)7.

As described above, according to the first embodiment of the invention, the first semiconductor chip $1a$ and the second semiconductor chip $1b$ can be freely combined with each other without being limited by their sizes and location of the electrodes therein.

Since a plurality of semiconductor chips are built in the same semiconductor device (package), the semiconductor device can be downsized and its mounting area can be reduced.

Further, without increasing the size of the semiconductor device (package), the plurality of semiconductor chips can be sealed in a monolithic semiconductor device and hence the semiconductor device can be realized with high integration and high performance.

(Second Embodiment)

In the second embodiment, in a series of steps of manufacturing the semiconductor device according to the first embodiment, the first wire bonding step and the second wire bonding step are replaced by each other.

Figure 5:
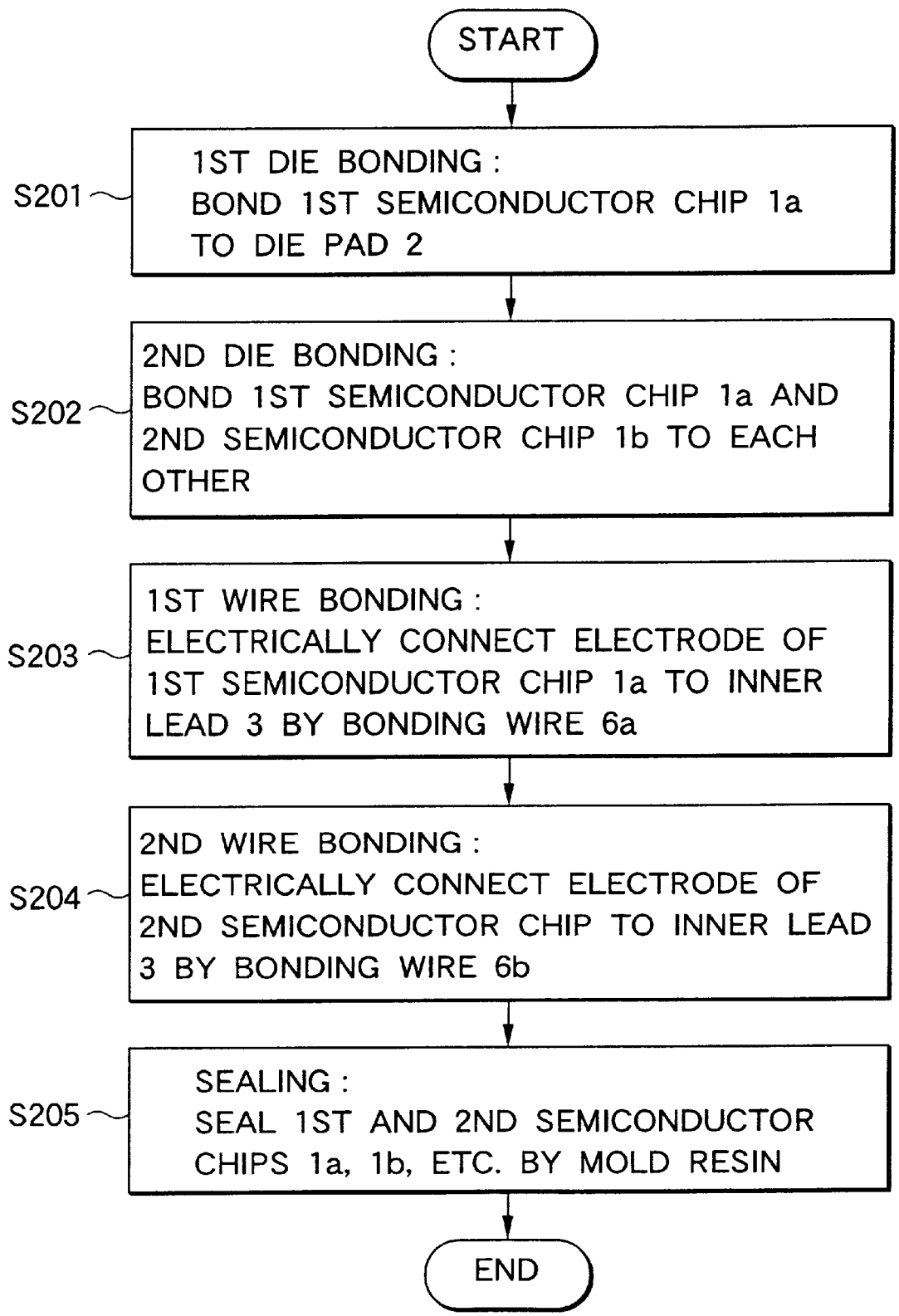
FIG. 5 is a flowchart showing a method for manufacturing the semiconductor device according to the second embodiment of the invention.

Now referring to FIGS. 5 and 6, an explanation will be given of a method for manufacturing the semiconductor device according to the second embodiment. FIG. 5 is a flowchart showing the method for manufacturing the semiconductor device according to the second embodiment. FIGS. 6A to 6C are longitudinal sectional views illustrating the respective manufacturing steps.

(1) First Die Bonding Step (S201 in FIG. 5)

Figure 6A:
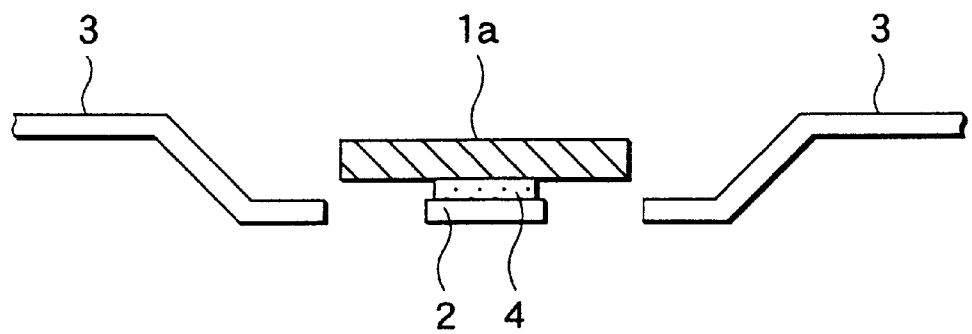
FIGS. 6A to 6C are longitudinal sectional views showing a process for manufacturing the semiconductor device according to the second embodiment of the invention.

As shown in FIG. 6A, an adhesive 4 is applied or pasted on a die-pad portion 2 of a lead frame. A first semiconductor chip 1a with its front surface oriented downward or toward the adhesive 4 is bonded to the die-pad portion 2. This step is the same as the corresponding step in the first embodiment.

(2) Second Die Bonding Step (S202 in FIG. 5)

Figure 6B:
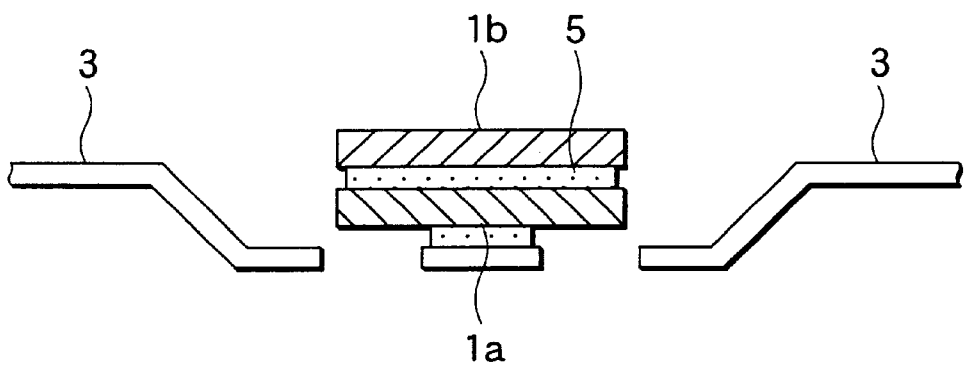
Figure 6C:
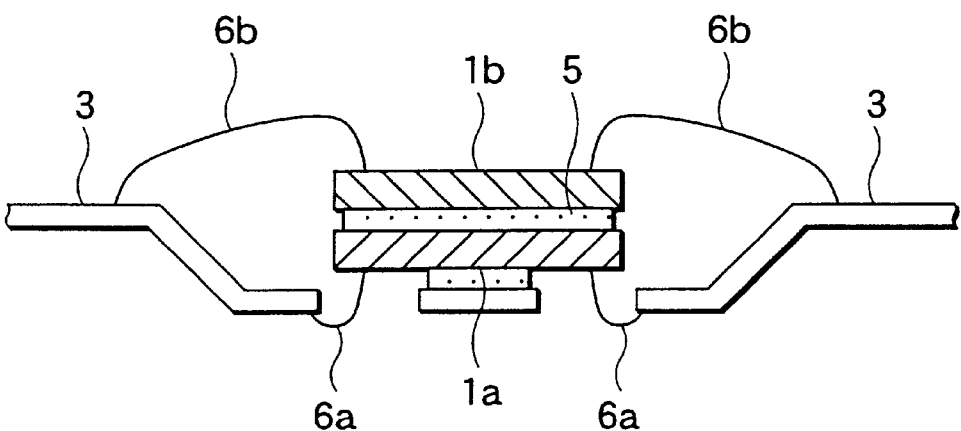

As shown in FIG. 6B, with the rear surface of the semiconductor chip 1a bonded to the die-pad portion 2 of the lead frame being oriented upward, an adhesive 5 is applied or pasted on the rear surface of the first semiconductor chip 1a (where no bonding electrode is located). The adhesive may be conductive or nonconductive, and paste- or film-type. With the front surface of a second semiconductor chip 1b (where the electrode is located) being oriented upward, from above the adhesive 5, the rear surface of the second semiconductor chip 1b and the rear surface of the first semiconductor chip 1a are bonded to each other.

(3) First Wire Bonding Step (S203 in FIG. 5)

With the lead frame being located upside down, i.e. the front surface of the first semiconductor chip 1a bonded to the die-pad portion 2 of the lead frame being oriented upward, the electrode on the front surface of the semiconductor chip 1a and the inner lead portion 3 of the lead frame are electrically connected to each other by a bonding wire 6a.

(4) Second Wire Bonding Step (S204 in FIG. 5)

As shown in FIG. 6c, again, with the lead frame being located upside down, i.e. the front surface of the second semiconductor chip 1b is oriented upward, the electrode on the front surface of the second semiconductor chip 1b is electrically connected to the inner lead portion 3 of the lead frame by a bonding wire 6b.

(5) Sealing Step (S205 in FIG. 5)

Finally, the first and the second semiconductor chip 1a, 1b, die-pad portion 2 of the lead frame, inner lead portion 3, bonding wires 6a, 6b, etc. are sealed by a sealant (mold resin)7.

Figure 7:
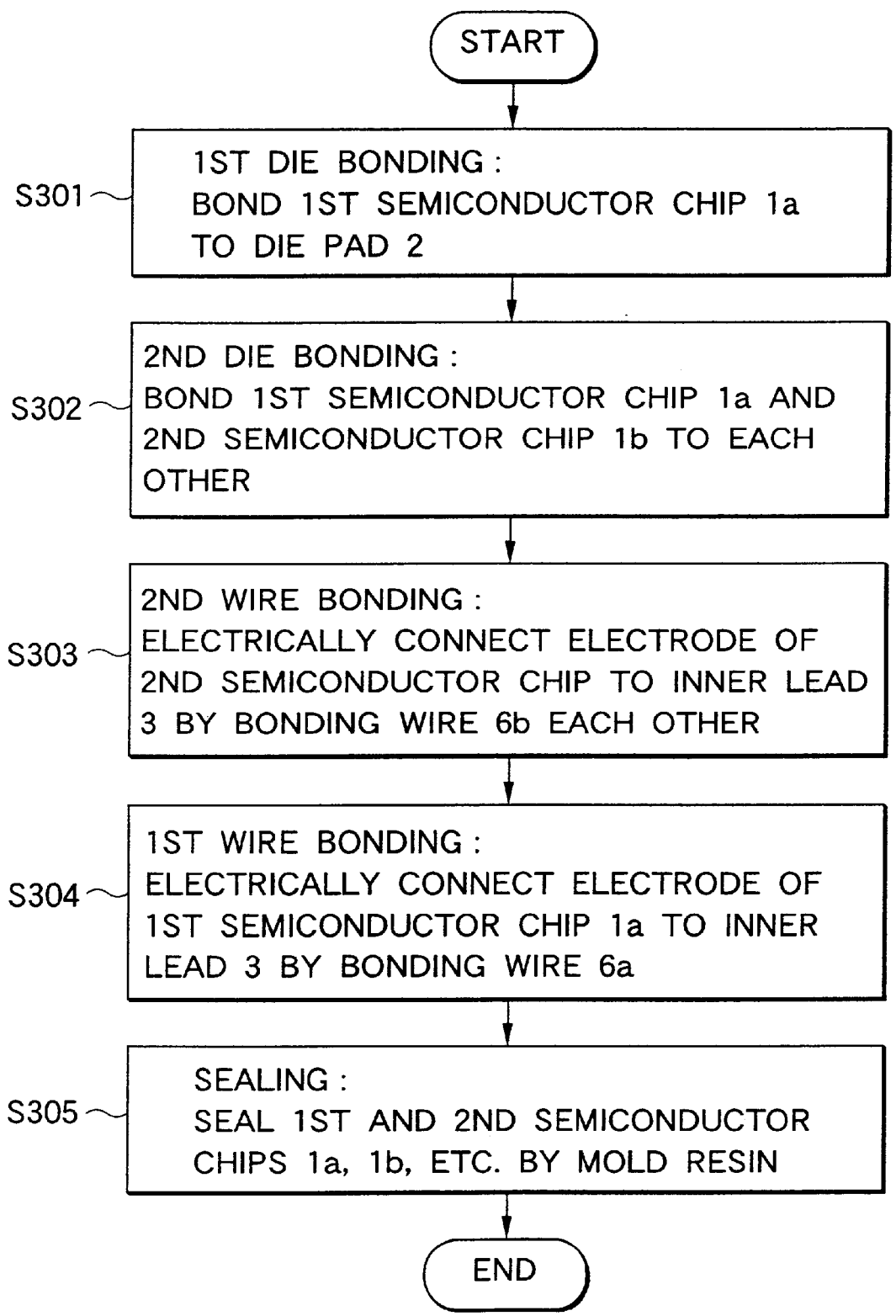
FIG. 7 is a longitudinal sectional view showing a process for manufacturing the semiconductor device according to the second embodiment of the invention.

In the second embodiment, in a series of steps of manufacturing the semiconductor device according to the second embodiment, as shown in FIG. 7, the first wire bonding step and the second wire bonding step may be replaced by each other.

Specifically, as described in S303 in FIG. 7, as a step subsequent to the second die bonding step in S302, with the front surface of the second semiconductor chip 1b oriented upward, the electrode on the front surface of the second semiconductor chip is electrically connected to the inner lead portion 3 of the lead frame by the bonding wire 6b. Thereafter, as described in S304 in FIG. 7, with the lead frame being located upside down, i.e. the front surface of the first semiconductor chip 1a bonded to the die-pad portion 2 of the lead frame being oriented upward, the electrode on the front surface of the first semiconductor chip 1a and the inner lead frame 3 of the lead frame are electrically connected to each other by the bonding wire 6a.

As described above, in the process for manufacturing the semiconductor device according to the invention, the first wire bonding step and the second wire bonding step can be replaced by each other so that an optimum method suited to the semiconductor device and its manufacturing facilities can be selected.

(Third Embodiment)

In the semiconductor device according to the third embodiment of the invention, the die-pad portion of the lead frame is used which is divided into plurality portions and/or has a hole. Through the divided portion and/or the interior of the hole, the electrode of the first semiconductor chip is electrically connected to the inner lead portion of the lead frame by a bonding wire.

Figure 8:
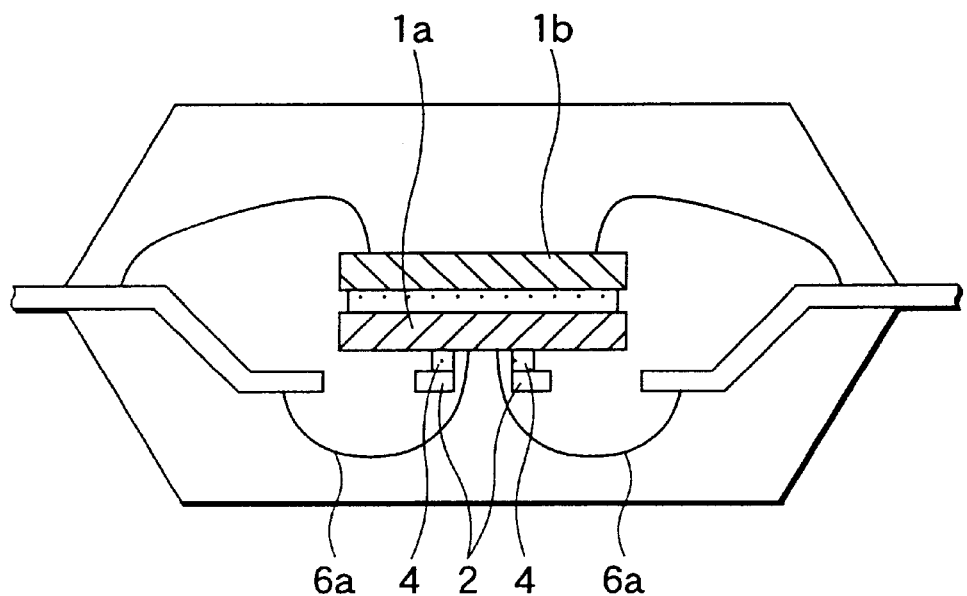
FIG. 8 is a sectional view showing the semiconductor device according to the third embodiment of the invention.

FIG. 8 is a sectional view of the semiconductor device according to the third embodiment of the invention. As seen from FIG. 8, the die-pad portion of the lead frame is divided in the vicinity of its center portion, or otherwise has a hole. An adhesive 4 is applied or pasted on the die-pad portion 2 which is divided or has the hole. The first semiconductor chip 1a with its front surface (where the bonding electrode is located) being oriented downward is bonded to the die-pad portion 2 of the lead frame. The remaining structure is the same as the first embodiment of the invention.

On the front surface of the first semiconductor chip 1a, a bonding electrode is provided in the vicinity of the center portion. The electrode and the inner lead portion of the lead frame are electrically connected to each other through the divided portion or hole of the die-pad portion 2 by the bonding wire 6a.

In the above embodiment, the die-pad portion 2 of the lead frame is divided or has a hole in the vicinity of the center portion. However, according to the electrode position of the front surface of the first semiconductor chip 1a, the arrangement of the divided portion or hole of the die-pad portion of the lead frame may be changed.

As described above, according to the third embodiment of the invention, the die-pad portion of the lead frame is used which is divided into a plurality of portions and has a hole, and through the divided portion and the interior of the hole, the bonding wire is extended from the first semiconductor chip. Therefore, such an arrangement can be applied to various types of electrodes formed on the front surface of the first semiconductor chip 1a.

(Fourth Embodiment)

In the semiconductor device according to the fourth embodiment of the invention, a plurality of first semiconductor chips are bonded to the die-pad portion of the lead frame.

Figure 9:
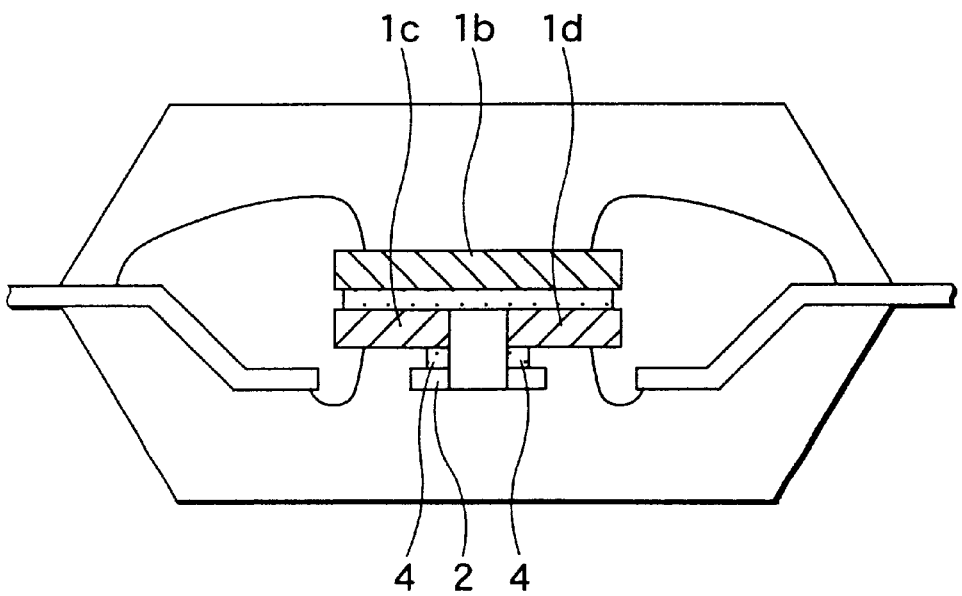
FIG. 9 is a sectional view showing the semiconductor device according to the fourth embodiment of the invention.

FIG. 9 is a sectional view showing the semiconductor device according to the fourth embodiment of the invention. As seen from FIG. 9, an adhesive 4 is applied or pasted on the die-pad portion of the lead frame. The plurality of first semiconductor chips 1c,1d with their front surface (where the bonding electrodes are provided) being oriented downward are bonded to the die-pad portion 2 of the lead frame. The remaining structure is the same as the first embodiment of the invention.

As described above, according to the fourth embodiment, since the plurality of first semiconductor chips are bonded to the die-pad portion of the lead frame, a multi-chip package can be realized in which a larger number of semiconductor chips are mounted.

(Fifth Embodiment)

In the semiconductor device according to the fifth embodiment, a plurality of second semiconductor chips are bonded to the rear surface of the first semiconductor chip.

Figure 10:
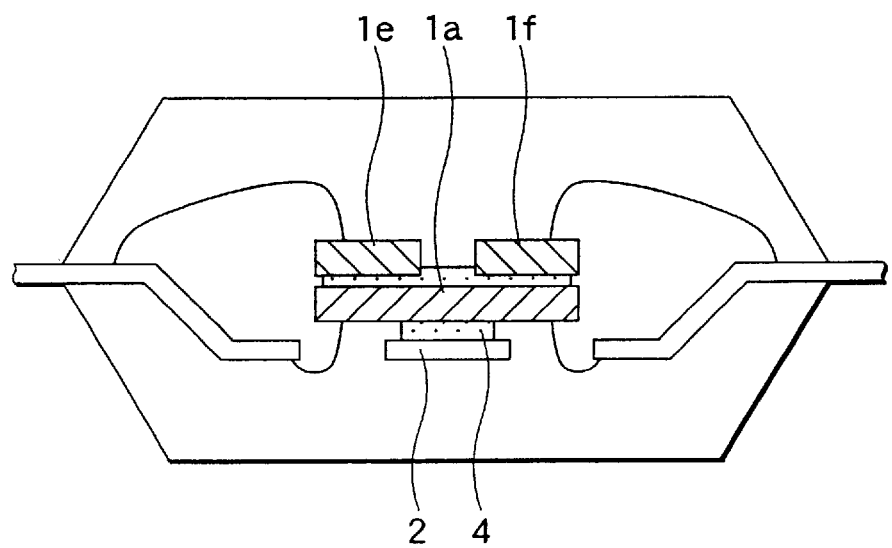
FIG. 10 is a sectional view showing the semiconductor device according to the fifth embodiment of the invention.
Figure 11:
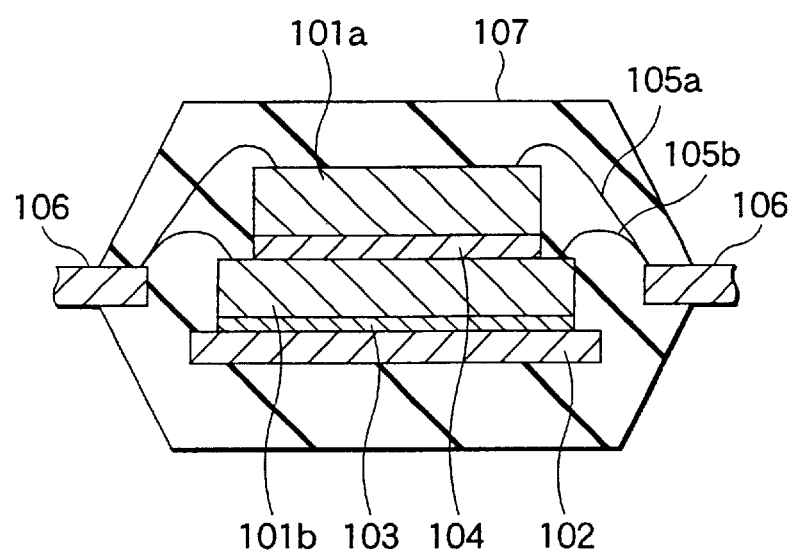
FIG. 11 is a sectional view of a conventional semiconductor device.
Figure 12:
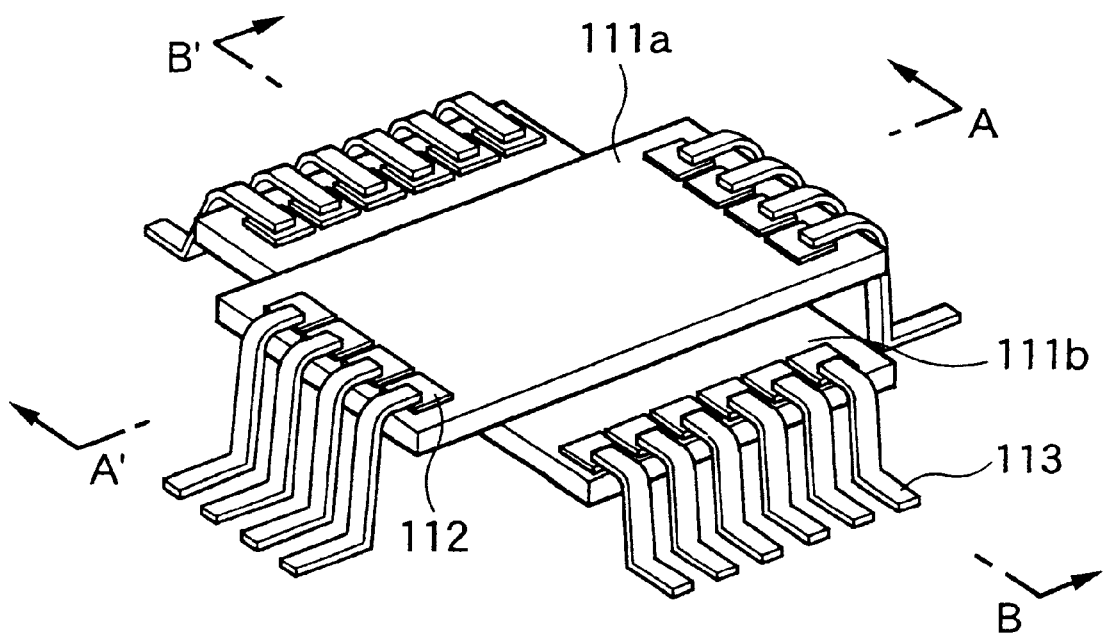
FIG. 12 is a sectional view of a conventional semiconductor device.

FIG. 10 is a sectional view of the semiconductor device according to the fifth embodiment of the invention. An adhesive 4 is applied to or pasted on the die-pad portion of the lead frame. The first semiconductor chip 1a with its front surface (where the bonding electrode is located) being oriented downward is bonded to the die-pad portion 2 of the lead frame. A plurality of semiconductor chips 1e and 1f with their rear surface being oriented downward are bonded to the rear surface of the first semiconductor chip 1a.

According to the fifth embodiment, since the plurality of second semiconductor chips are bonded to the rear surface of the first semiconductor chip, a multi-chip package can be realized in which a larger number of semiconductor chips are mounted.

According to the inventions defined in claims 1 to 4, since a plurality of semiconductor chips are built in the same semiconductor device (package), the semiconductor device can be downsized and its mounting area can be reduced.

Further, without increasing the size of the semiconductor device (package), the plurality of semiconductor chips can be sealed in a monolithic semiconductor device and hence the semiconductor device can be realized with high integration and high performance.

Furthermore, a multi-chip package can be realized without being limited by the combination or arrangement of a plurality of semiconductor chips.

According to the invention defined in claim 2, the die-pad portion of the lead frame is used which is divided into plurality portions and has a hole, and through the divided portion and the interior of the hole, the bonding wire is extended from the first semiconductor chip. Therefore, such an arrangement can be applied to various types of electrodes formed on the front surface of the first semiconductor chip 1a.

According to the invention defined in claim 3, since the plurality of first semiconductor chips are bonded to the die-pad portion of the lead frame, a multi-chip package can be realized in which a larger number of semiconductor chips are mounted.

According to the invention defined in claim 4, since the plurality of second semiconductor chips are bonded to the rear surface of the first semiconductor chip, a multi-chip package can be realized in which a larger number of semiconductor chips are mounted.

According to the invention defined in claims 5–7, in the process for manufacturing the semiconductor device according to the invention, the first wire bonding step and the second die bonding step are replaced by each other so that an optimum method suited to the semiconductor device and its manufacturing facilities can be selected.

What is claimed is:

1. A semiconductor device comprising:

a first semiconductor chip with a front surface side (where a bonding electrode is located) bonded to a die-pad portion of a lead frame, and a second semiconductor chip with a rear surface bonded to the rear surface of said first semiconductor chip, wherein an electrode on the front surface of said first semiconductor chip and an inner lead portion of said lead frame are electrically connected to each other by a wire, and an electrode on the front surface of said second semiconductor chip and the inner lead portion are electrically connected to each other by said wire.

2. The semiconductor device according to claim 1, wherein said die-pad portion of the lead frame is divided into plurality portions or has a hole, and through the divided portion and/or the interior of the hole, said wire is electrically extended from said electrode of said first semiconductor chip to said inner lead portion of said lead frame.

3. The semiconductor device according to claim 1, wherein a plurality of first semiconductor chips are bonded to the die-pad portion of said lead frame.

4. The semiconductor device according to claim 1, wherein a plurality of said second semiconductor chips are bonded to said first semiconductor chip.

* * * * *